United States Patent [19]

Yamada et al.

[11] Patent Number: 4,459,496
[45] Date of Patent: Jul. 10, 1984

[54] SEMICONDUCTOR INTEGRATED CIRCUIT HAVING STACKED INTEGRATED INJECTION LOGIC CIRCUITS

[75] Inventors: Haruyasu Yamada, Hirakata; Toyoki Takemoto, Yahata; Tadao Komeda, Ikoma; Tsutomu Fujita; Yuichi Hirofuji, both of Hirakata; Hiroyuki Sakai, Moriguchi, all of Japan

[73] Assignee: Matsushita Electric Industrial Company, Limited, Osaka, Japan

[21] Appl. No.: 251,966

[22] Filed: Apr. 3, 1981

[30] Foreign Application Priority Data

Apr. 4, 1980 [JP] Japan ................................. 55-44888
Apr. 4, 1980 [JP] Japan ................................. 55-44889

[51] Int. Cl.³ ................ H03K 19/091; H03K 19/092
[52] U.S. Cl. ..................................... 307/459; 307/477
[58] Field of Search ............... 307/446, 459, 475, 477; 330/288; 357/92

[56] References Cited

U.S. PATENT DOCUMENTS 4,009,397  2/1977  Mulder et al. ....................... 307/459
4,013,901  3/1977  Williams ......................... 307/477 X
4,109,162  8/1978  Heuser et al. ....................... 307/477
4,243,896  1/1981  Chapron ........................... 357/92 X
4,256,984  3/1981  Kojima ........................... 307/475 X

OTHER PUBLICATIONS

Kaneko et al., "Stacked I²L Circuit", *IEEE Journal of Solid-State Circuits*, Apr., 1977, pp. 210-212.

*Primary Examiner*—Larry N. Anagnos
*Assistant Examiner*—David R. Hudspeth
*Attorney, Agent, or Firm*—Lowe, King, Price & Becker

[57] ABSTRACT

In a stacked, multilayer IIL (integrated injection logic) circuit, with which power consumption can be significantly reduced, a discharging circuit constructed of an IIL constant-current circuit or of a resistor is provided for one of transistors which are used for shifting the level of a signal from an IIL circuit of a top layer to an IIL circuit of a bottom layer, so that signal transmission therebetween is prevented from deterioration. A charging circuit may be added to another transistor, while a diode may be interposed between these transistors. Additional diodes may be interposed between adjacent layers for speeding up the signal transmission from one layer to another upper layer.

22 Claims, 6 Drawing Figures

SEMICONDUCTOR INTEGRATED CIRCUIT HAVING STACKED INTEGRATED INJECTION LOGIC CIRCUITS

BACKGROUND OF THE INVENTION

This invention generally relates to a semiconductor integrated circuit having low-power consumption circuits made of integrated injection logic (IIL) circuits.

The operating voltage of an IIL circuit is approximately 0.8 volt, which is lower than those of TTLs and ECLs, while the current flow per gate is small, and therefore, IIL circuits consume less power. Meanwhile, IIL circuits can be manufactured by the manufacturing process of bipolar transistors. Therefore, by combining IILs and bipolar transistors, both having less element area, on the same substrate, it is possible to increase the degree of integration density of a semiconductor integrated circuit.

Customary semiconductor elements having bipolar transistors are difficult to operate with a voltage of 0.8 volt. That is 5 volts is usually applied to TTLs, and 10 volts to linear ICs. Accordingly, an IC, in which customary bipolar transistors and IILs are combined, requires two different power supplies. However, since IILs are of a constant-circuit driven type, a voltage of 0.8 volt cannot be simply applied thereto. Namely, a current flowing through an IIL circuit has to be limited by connecting it to a low-voltage power source or by connecting a resistor in series thereto. In such a combined IC, it is a usual practice that the power source used for the bipolar transistors is used by connecting a resistor in series. In this case, most of the electrical power is consumed by the series resistor, and therefore, the advantage of low-power consumption by an IIL structure is cancelled.

In such a combined IC, the grounded or reference point of the IIL circuit included therein corresponds to the collectors of bipolar transistors, and therefore, the IIL circuit can be separated from the silicon substrate. Moreover, since the amount of current flowing into the grounded point does not vary in accordance with the switching condition of each IIL gate, the entire IIL circuit may be divided into a plurality of sections. Namely, a plurality of IIL circuits each including at least one IIL gate may be stacked in the form of multilayer so that voltage efficiency may be increased. For instance, when the entire IIL circuit is divided into two, the divided IIL circuits may be stacked in such a manner that the injection input terminal of an IIL circuit is connected to the power source, and the ground point of this IIL circuit is connected to the injector input terminal of the other IIL circuit whose ground point is used as the ground point of the entire stacked circuit. With this arrangement, the total power consumption can be reduced by half because the total current flowing through the entire circuit is only one-half that of unstacked arrangement, while the current per each IIL gate is maintained the same. Additionally, if the entire IIL arrangement is further divided into different numbers of circuits, the total power consumed may be reduced to ⅓, ¼ and so on.

In such a stacked IIL circuit configuration, there is a problem in connection with a circuit for transmitting a signal from the top or upper layer to the bottom or lower layer or vice versa. Namely, if shifting of the signal bias level were satisfactorily performed, the operation of the IIL circuit would be apt to be unstable and/or the delay time in signal transmission is apt to increase.

FIG. 1 shows an example of a conventional circuit arrangement of a stacked IIL circuit. This example is a q-stage ring oscillator, which is constructed of seven gate circuits 3 having an IIL structure including a first or bottom layer having three gates connected in parallel, a second or middle layer and a third or upper layer each having two gates connected in parallel, which threee layers are stacked to form a three-layer structure. In FIG. 1, the reference numerals 1-1 to 1-7 are npn transistors for switching respective IIL gates 3-1 to 3-7 numerals; 2-1 to 2-7 are pnp transistors functioning as active loads of respective IIL gates 3-1 to 3-7. Each of the IIL gates 3-1 to 3-7 is constructed of the transistors 1-1 and 2-1, 1-2 and 2-2 and so on. As described above, in the first layer, three gate circuits 3-1 to 3-3 are connected in parallel, while in each of the second and third layers, two gate circuits 3-4 and 3-5, 3-6 and 3-7 are connected in parallel. The references 4 and 5 are respectively a pnp transistor and an npn transistor for effecting level shifting of the signal to be transmitted from the third layer to the first layer, and each of the transistors 4 and 5 constitutes one stage of the 9-stage ring oscillator. The reference numerals 6 to 9 indicate common lines, and in this example, the common line 6 is at ground potential; the common line 7, approximately 0.8 volt; the common line 8, approximately 1.6 volt; and the common line 9, approximately 2.4 volt. The reference numeral 10 is a constant-current source.

In the conventional circuit of FIG. 1, the transmission of the signal from the left-most IIL gate 3-1 of the first layer to the left-most IIL gate of the second layer is effected by only connecting the collector of the npn transistor 1-1 of the first layer to the base of the transistor 1-4 of the second layer, and thus no level shifting is required. Signal transmission from the collector of the transistor 1-5 of the right-most IIL gate 3-5 of the second layer to the base of the transistor 1-6 of the left-most IIL gate 3-6 of the third layer is also effected in the same manner. In this circuit, it is to be noted that the base voltage of the transistor 1-4 of the second layer becomes ground potential when the transistor 1-1 of the first layer turns on. Accordingly, the voltage variation range at the base of the transistor 1-4 of the second layer is 1.6 volt because the voltage of 0.8 volt between the base and emitter of the transistor 1-4 of the second layer is added to the voltage of 0.8 volt at the common line 7 although the base voltage variation range in a singlelayer IIL arrangement is only 0.8 volt or so. In other words, when the IIL gates 3-1 to 3-7 are constructed in the form of a single layer, the base voltage of each of the transistors 1-1 to 1-7 varies between its emitter voltage, i.e. ground potential, and a base voltage (approximately 0.8 volt) in the on-state thereof. However, when the IIL circuit is divided into a plurality of sections, for instance, into two as described above, to be stacked in the form of two layers, the base voltage variation range in connection with the transistor 1-4 becomes approximately 1.6 volt. Therefore, it takes twice the interval required in a single-layer arrangement for the base voltage to be increased to 1.6 volt because the base voltage of the transistor 1-4 of the second layer rises by charging a parasitic capacitance between its base and collector or emitter after the transistor 1-1 of the first layer becomes on from an off-state. This is because the collector current of the transistor 2-4 of the second layer is constant, and therefore, the parasitic capacitance is charged at a constant rate.

Although operation has been described in connection with the transistor 1-4 of the second layer, the transistor 1-6 of the third layer operates in the same manner. Namely, the range of the voltage variation at the base of the transistor 1-6 in the third layer is as great as 2.4 volt or so, and accordingly the transistor 1-6 requires more time until it turns on.

In the circuit of FIG. 1, the signal to be transmitted from the third layer to the first layer cannot be satisfactorily transmitted without level shifting, and therefore, transistors 4 and 5 are added for effecting level shifting. In this example, the signal from the IIL gate 3-7 is once inverted by the transistor 4, and is further inverted by the transistor 5. Namely, the transistors 4 and 5 constitute a two-stage gate circuit whose structure is different from that of an IIL circuit, and the entire circuit arrangement of FIG. 1 functions as a 9-stage ring oscillator.

The problem in level shifting is that it takes a long period of time for the transistor 4 to turn off when the transistor 1-7 connected to the transistor 4 turns off. This is because the voltage at the base of the transistor 4 cannot rise rapidly because there is no path for charging the parasitic capacitance around the point A in the vicinity of the base of the transistor 4; namely, the voltage at the base thereof gradually rises as the parasitic capacitance is charged by a small current from the emitter of the transistor 4. Another problem is that it takes a long period of time for the transistor 5 to become off in a similar manner because there is no path for discharging the charge stored in the parasitic capacitance at the base side of the transistor 5.

For this reason, in the conventional stacked structure of logic circuits of FIG. 1, delay in signal transmission time increases at the above-mentioned level shifting portion. Therefore, when AND and/or OR gates are formed in IIL circuits, the input signals of these logic gates are apt to be difficult to synchronize with its clock pulse, causing these logic circuits to malfunction.

SUMMARY OF THE INVENTION

The present invention has been developed in order to remove the above-mentioned disadvantages and drawbacks inherent to the conventional stacked IIL circuit arrangement.

It is, therefore, a primary object of the present invention to provide a new and useful semiconductor integrated circuit having stacked IIL circuits so that signal transmission delay at its level shifting portion can be improved.

Another object of the present invention is to provide a stacked IIL arrangement in which transmission time for one layer to an adjacent layer has been reduced so that the IIL arrangement is capable of stably operating with high speed.

In accordance with the present invention there is provided a semiconductor integrated circuit comprising:

(a) a plurality of IIL circuits each having a plurality of IIL gates constructed of a plurality of transistors, said IIL circuits being stacked in the form of multi-layer in such a manner that an injection input terminal of an $n^{th}$ layer in the stacked arrangement is connected to a ground terminal of an $(n+1)^{th}$ layer, wherein "n" is an integer.

(b) first means for transmitting a signal from each of said layers to another one of said layers;

(c) second means for shifting the level of a signal from a given layer, said second means having a first transistor whose base is connected to an output terminal of said given layer, and a second transistor whose base is responsive to a signal from said first transistor, said second transistor being connected to an input terminal of another one of said layers; and (d) a discharging circuit connected to said base of said second transistor.

BRIEF DESCRIPTION OF THE DRAWINGS

These and other objects and features of the present invention will become more readily apparent from the following detailed description of the preferred embodiments taken in conjunction with the accompanying drawings in which.

DETAILED DESCRIPTION OF THE PREFERRED EMBODIMENTS

Figure 2:
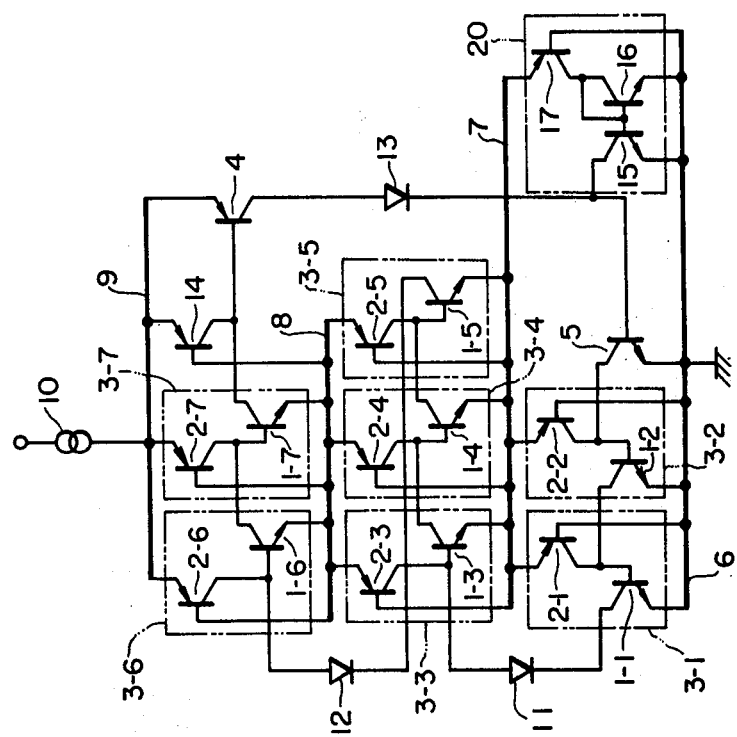
FIG. 2 is a circuit diagram of a ring oscillator constructed of a stacked IIL arrangement, which is an embodiment of the present invention.

Reference is now made to FIG. 2 which shows a circuit diagram of a stacked IIL circuit, corresponding to an embodiment of the present invention. The concept and arrangement according to the present invention will be described with reference to FIG. 2, which shows a 9-stage ring oscillator in the same manner as FIG. 1.

Figure 1:
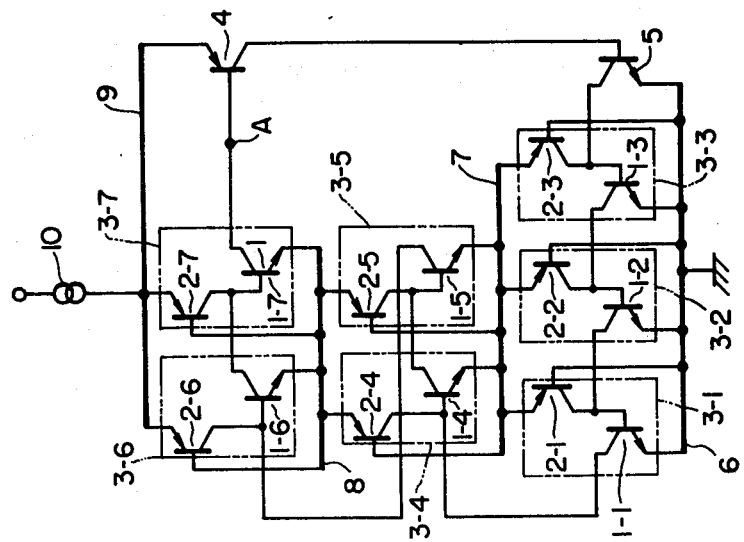
FIG. 1 is a circuit diagram of a ring oscillator formed on the basis of the conventional stacked ILL arrangement.

In FIG. 2, the same or corresponding elements and parts as in the conventional example of FIG. 1 are designated at like numerals. The circuit of FIG. 2 generally comprises three layers of IIL circuits. The bottom or first layer comprises two IIL gates 3-1 and 3-2, the middle or second layer comprises three IIL gates 3-3, 3-4 and 3-5, and the upper or third layer comprises two IIL gates 3-6 and 3-7. Although the total number of IIL gates is the same as that of FIG. 1, the numbers of IIL gates in the first and second layers have been changed from those of FIG. 1 so that current flowing through each of the IIL gates is substantially constant throughout the entire circuit.

Each of the IIL gates 3-1 to 3-7 comprises a load transistor 2-1 to 2-7, i.e. an injector, and a switching transistor 1-1 to 1-7. First to fourth common lines 6 to 9 are provided so that the IIL circuit of the first layer is interposed between the first and second common lines 6 and 7, the second layer IIL circuit is between the second and third common lines 7 and 8, and the third layer IIL circuit is between the third and and fourth common lines 8 and 9. The first common line 6 is connected to ground, while the fourth common line 9 is connected to a power source 10. The two transistors in each IIL gate 3-1 to 3-7 are connected in a similar manner. For instance, the emitter of the load transistor 2-1 in the first gate 3-1 of the first layer is connected to the second common line 7 which functions as a ground line of the second layer IIL circuit, i.e. the gates 3-3 to 3-5. The base of the transistor 2-1 is connected to the first common line, while the collector of the same is connected to the base of the switching transistor 1-1, the emitter of which is connected to the first common line 6. The base of the switching transistor 1-1 is connected to the collector of another switching transistor 1-2 of a former stage gate 3-2 so as to receive a signal therefrom.

First and second transistors 4 and 5 which are not arranged in the form of an IIL structure are provided in such a manner that the emitter of the first transistor 4, which is of pnp type, is connected to the fourth common line 9, and the emitter of the second transistor 5, which is of pnp type, is connected to the first common line 6. The base of the first transistor 4 is connected to the collector of the transistor 1-7 of the third layer, where the collector of the transistor 1-7 functions as an output terminal of the third layer IIL circuit. The collector of the second transistor 5 is connected to the base of the transistor 1-2 of the first layer, where the base of the transistor 1-2 functions as an input terminal of the first layer ILL circuit. The above-described structure of stacked IIL arrangement is substantially the same as that of the conventional arrangement of FIG. 1. The embodiment of FIG. 2 differs from the arrangement of FIG. 1 in the following points.

Between the collector of the switching transistor 1-1 of the first layer and the base of the switching transistor 1-3 of the second layer is interposed a diode 11, while between the collector of the switching transistor 1-5 of the second layer and the base of the switching transistor 1-6 of the third layer is interposed another diode 12. These diodes 11 and 12 are provided for effecting signal level shifting as will be described hereinlater. Another diode 13 is interposed between the collector of the transistor 4 and the base of the transistor 5, and this diode 13 is also provided for effecting signal level shifting.

In addition to these three diode 11 to 13, a pnp transistor 14, which functions as a charging circuit, and a discharging circuit 20 constructed of three transistors 15, 16 and 17 are respectively provided. In detail, the transistor 14 is connected in the same manner as the load transistor, i.e. the injector, 2-1 to 2-7 of each IIL gate 2-1 to 2-7; namely, the emitter of the transistor 14 is connected to the fourth common line 9, while the base of the same is connected to the third common line 8. The collector of the transistor 14 is connected to the base of the transistor 4, so that the transistor 14 functions as a constant-current circuit. On the other hand, the discharging circuit 20 is arranged such that the emitter of the transistor 17 is connected to the second common line 7, while the base of the same is connected to the first common line 6. Namely, the transistor 17 constitutes a constant-current circuit. The collector of the transistor 17 is connected to the collector of the transistor 16 and to the bases of the transistors 15 and 16 whose emitters are connected to the first common line 6. The collector of the transistor 15 is connected to the base of the transistor 5. With this arrangement, the transistors 15 and 16 constitute a current-mirror circuit. As a result, the entire discharging circuit 20 functions as a constant-current discharging or load circuit.

In FIG. 2, signal transmission from the first layer to the second layer is performed by transmitting the signal from the collector of the transistor 1-1 via the diode 11 to the base of the transistor 1-3. Signal transmission from the second layer to the third layer is performed by transmitting the signal from the collector of the transistor 1-5 via the diode 12 to the base of the transistor 1-6. When the transistor 1-1 of the first layer is in the off-state, the voltage at the base of the transistor 1-3 of the second layer equals the sum of the voltage at the second common line 7, which voltage is approximately 0.8 volt because it corresponds to the voltage between the emitter and base of the transistor 2-3 of the second layer, and the voltage between the emitter and base of the transistor 1-3 of the second layer. Namely, the sum equals approximately 1.6 volt. When the transistor 1-1 of the first layer turns on, the transistor 1-3 of the second layer turns off because the collector current of the transistor 2-3 of the second layer flows via the diode 11 to the transistor 1-1. During the on-state of the transistor 1-1 although the voltage at the collector of the transistor 1-1, is substantially zero, the base voltage of the transistor 1-3 of the second layer is approximately 0.8 volt because of the presence of the forward voltage of the diode 11, and thus the base voltage thereof is substantially equal to the voltage at the second common line 7. Accordingly, the range of the voltage variation at the base of the transistor 1-3 is approximately 0.8 volt in the same manner as in an ordinary switching transistor arranged in a single layer.

On the other hand, in the case that the transistor 1-1 of the first layer turns off, the voltage at the base of the transistor 1-3 of the second layer rises from 0.8 volt to 1.6 volt by charging the junction capacitance between the base and collector of the transistor 1-3 and the other junction capacitance between the emitter and base of the same as well as parasitic capacitance around peripheral connections by the constant current from the collector of the transistor 2-3 of the second layer. Consequently, the base voltage rise time is only one-half the rise time in the case of rising from zero volt to 1.6 volt as in the conventional arrangment.

From the above, it will be understood that the voltage variation range at the base of the transistor 1-3 of the second layer can be reduced to 0.8 volt, which is one-half the range in the conventional example of FIG. 1.

Similarly, with the provision of the diode 12 between the second and third layers, the base voltage variation range of the transistor 1-6 of the third layer becomes 0.8 volt because of forward voltage of the diode 12. Therefore, in the presence of the diodes 11 and 12, the signal transmission time from the first layer to the second layer, and from the second layer to the third layer can be significantly reduced. Although the number of stacked layers in the above embodiment is three, the number may be changed if desired, and a similar diode may be interposed between adjacent layers in the same manner.

Nextly, it will be described how a signal is transmitted from the third layer to the first layer. The signal transmission from the third layer to the first layer is performed via the transistors 4 and 5 and the diode 13. Since the aforementioned pnp transistor 14, which is similar to any one of the load transistors 2-1 to 2-7 (injector) of the IIL gates 3-1 to 3-7, is connected to the base of the transistor 4, the transistor 1-7 of the third layer has to have a current amplification factor, which is sufficient for drawing the collector current of the transistor 14 as well as the base current of the transistor 4. When the transistor 1-7 of the third layer turns off from its on-state, the stray capacitance around the base of the transistor 4 is rapidly charged by the current from the transistor 14 because the base of the transistor 4 is connected to the collector of the transistor 14, while the emitter of the transistor 14 is connected to via the fourth common line 9 to the power source 10. As a result, the voltage at the base of the transistor 4 rapidly rises toward the power source voltage, and thus the transistor 4 turns off from its on-state. In other words, the transistor 14 functions as a rapid charging circuit so as to increase the switching speed of the transistor 4.

The diode 13 is used not only for level shifting but also for limiting the collector current of the transistor 4 during the on-state thereof so the distribution of the current from the power source 10 via the fourth common line 10 to the injector transistors 2-6, 2-7 and 14, and to the transistor 4 is well balanced. In detail, when the transistor 5 is in its on-state, the collector voltage of the transistor 4 is approximately 1.6 volt in the presence of the diode 13, and thus the voltage at the collector of the transistor 4 equals the voltage at the third common line 8.

The discharging circuit 20, constructed of the transistors 15, 16 and 17, speeds up the off operation of the transistor 5. A constant current is forced to flow from the transistor 17 into the transistor 16, and a current equal to this constant current flows through the collector of the transistor 15. Therefore, charge stored at the base of the transistor 5 is rapidly discharged via this discharging circuit 20, so that the switching time of the transistor 5 can be reduced.

As described with reference to the embodiment of FIG. 2, with the provision of the discharging circuit 20, which discharges the base charge of the transistor 5, the switching speed of the transistor 5 can be improved by more than one order of magnitude compared to that of the conventional circuit. Furthermore, by using the transistor 14, i.e. a charging circuit, and the diodes 11, 12 and 13, the operating speed of the entire stacked IIL arrangement can be considerably improved.

Figure 3:
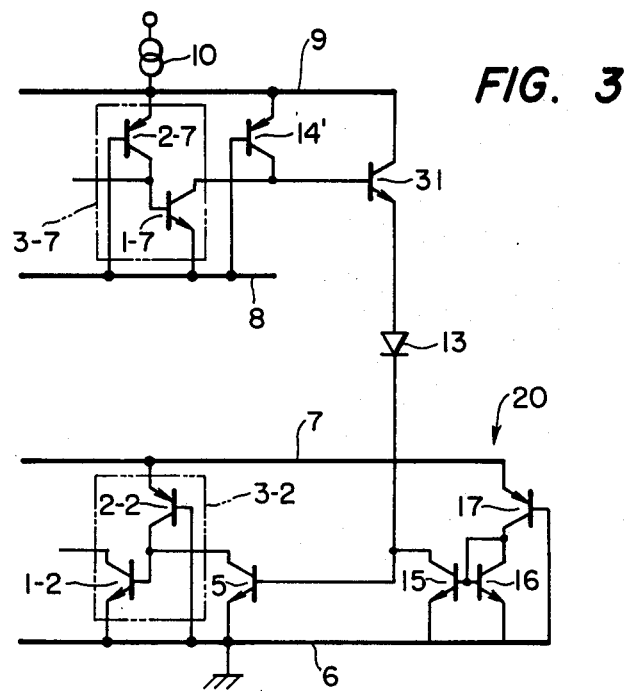
FIG. 3 is a circuit diagram of another embodiment of the present invention, in which embodiment an npn transistor is used in place of the pnp transistor of FIG. 2 for effecting level shifting.

FIG. 3 is a partial view of another embodiment of the present invention, and the same elements and parts as in FIG. 2 are designated at like numerals. Although the circuit of FIG. 3 is of a three-layer configuration, the second layer is not shown for simplicity. An npn transistor 31 corresponds to the pnp transistor 4 of FIG. 2. Signal transmission from the third layer to the first layer is performed via the transistor 31, the diode 13 and the transistor 5. The arrangement of FIG. 3 differs from that of FIG. 2 in that the transistor 31 is of npn type, and the signal applied thereto is not inverted by the transistor 31. During off-stage of the transistor 1-7, the collector current of the transistor 14', which functions as the injector, i.e. the load, of the transistor 1-7, becomes the base current of the transistor 31, and therefore, the transistor 5 turns on. The transistor 14' is employed for supplying the transistor 31 with a base current, which is necessary because the transistor 31 is of npn type. The collector current of the transistor 14' is so small that there may be concern that the transistor 5 cannot be properly turned on. Therefore, in this embodiment, the collector current of the transistor 14' is amplified by the transistor 31 to drive the transistor 5. As a result, the transistor 5 can be properly turned on. On the other hand, in the case that the transistor 1-7 is in the on-state, the collector current of the transistor 14' flows into the transistor 1-7, and thus the transistor 31 turns off. This is because the sum of the base-emitter voltage of the transistor 5, the forward voltage of the diode 13 and the base-emitter voltage of the transistor 31 is insufficient for driving a current therethrough. The diode 13 will be unnecessary when it is intended to perform signal transmission in a stacked two-layer arrangement. The diode 13 is useful for limiting the current via the transistor 31 during its on-state. The function and effect of the discharging circuit 20 constructed of the transistors 15, 16 and 17 are the same as those of FIG. 2.

In the embodiment of FIG. 3, since the level shift transistor 31 is of npn type, and operates in a different way from IIL operation, its current amplification factor is large so that a current sufficient for properly driving the transistor 5 of the first layer can flow through the emitter of the transistor 31. However, a transistor arranged in the form of IIL may be used in place of such a transistor 31.

Figure 4:
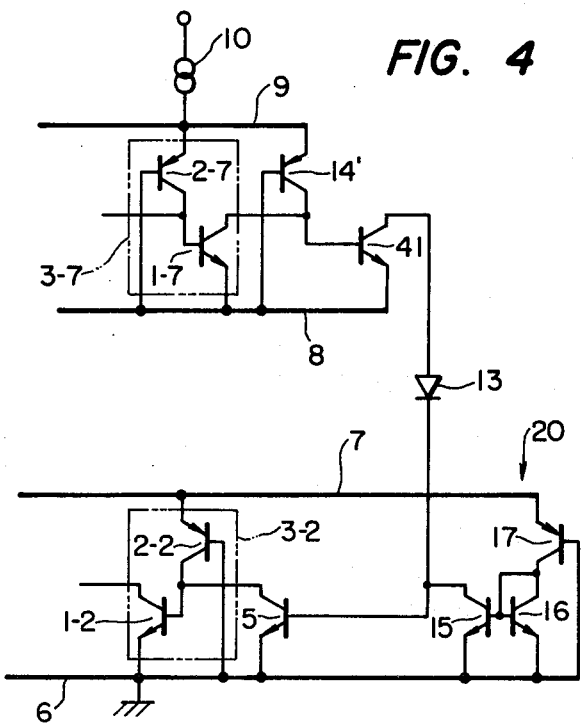
FIG. 4 is a circuit diagram of another embodiment of the present invention, in which embodiment level shifting is effected by a transistor formed in an IIL arrangement and a diode.

Hence, reference is now made to FIG. 4 which is a partial circuit diagram of another embodiment in which transmission time is improved in the above-mentioned manner; namely by using a transistor incorporated in an IIL arrangement. The same elements and parts as in FIG. 2 are designated at like numerals, while portions unnecessary for the description are not shown. In FIG. 4, the reference numeral 41 is an npn transistor whose collector is connected via the diode 13 to the base of the transistor 5, and the transistor 41 has an IIL structure. The transistor 41 corresponds to the pnp transistor 4 of FIG. 2, while no signal inversion is effected therin. Signal transmission from the third layer to the first layer is performed via the transistor 41, the diode 13 and the transistor 5. In the case that the transistor 1-7 is in the on-state, the collector current of the transistor 14' flows into the transistor 1-7, and therefore the transistor 41 is in the off-state. Accordingly, the transistor 5 is in the off-state at this time. When the transistor 1-7 turns off, the collector current of the transistor 14' flows into the base of the transistor 41 as its base current so that the transistor 41 turns on. As a result, the transistor 5 turns on in the presence of the collector current of the transistor 41. Since the transistor 41 is one having an IIL structure, the base current thereof flows into both the emitter and collector thereof, and therefore, the collector current of the transistor 41 is smaller than that in the embodiment of FIG. 3. The diode 13 is used for ensuring the on-off operations of the transistors 41 and 5 in the same manner as described in connection with FIG. 3. Such a diode is not needed between adjacent layers. The transistors 15, 16 and 17 constitute a constant-current circuit 20 which speeds up the switching operation of the transistor 5 by discharging the base charge. The operation of the constant-current discharging circuit is the same as that of FIG. 2, and therefore, further description thereof is omitted.

Figure 5:
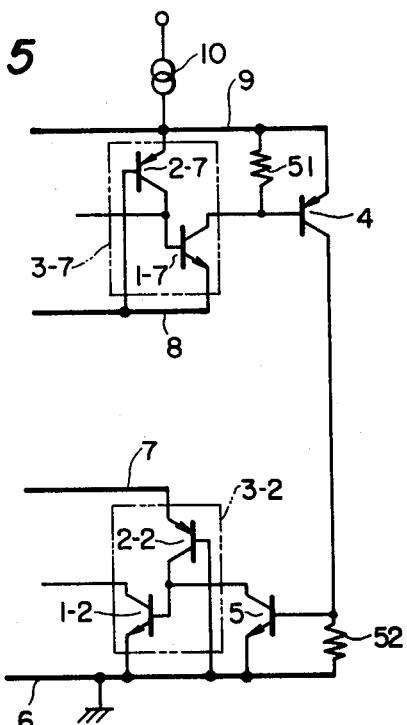
FIG. 5 is a circuit diagram of another embodiment of the present invention, in which embodiment a resistor is provided for adjusting the base voltage of a transistor used for level shifting.

FIG. 5 illustrates partially a circuit diagram of another embodiment of the present invention, which embodiment is a modification of the circuit of FIG. 2. Namely, the manner of signal transmission from the third layer to the first layer is the same as that of FIG. 2, and the same elements and parts as in FIG. 2 are designated at like numerals. Unnecessary portions in the circuit for the description are not shown in FIG. 5.

In the embodiment of FIG. 5, the base charges of the transistors 4 and 5, which are used for signal transmission, are charged and discharged through resistors. A resistor 51 connected betweeen the emitter and base of the transistor 4 is used for charging the base of the transistor 4 to cause the base voltage to rise during the off-state of the transistor 1-7. A resistor 52 connected between the base and emitter of the transistor 5 is used for discharging the base charge of the transistor during the off-state of the transistor 4. These charging and discharging resistors 51 and 52 may be effectively used in the case that the current flowing through the injector transistor 2-6 and 2-7 is constant.

Figure 6:
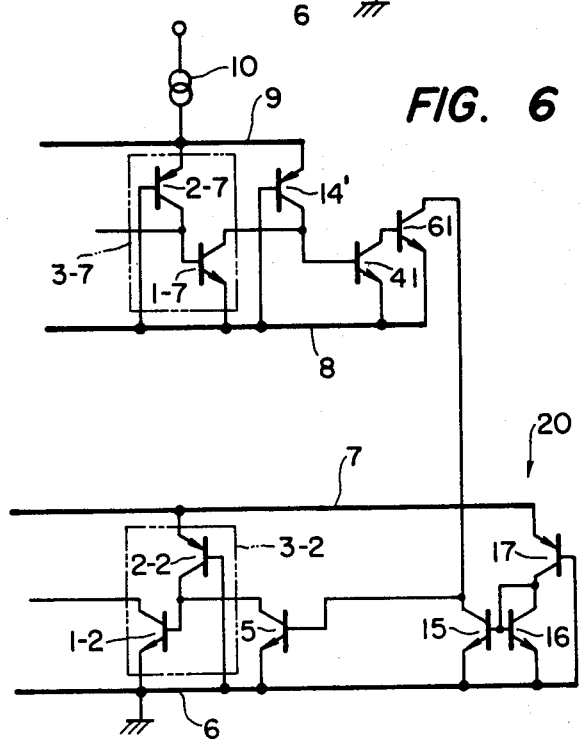
FIG. 6 is a circuit diagram of another embodiment of the present invention, in which embodiment two-stage transistors arranged in the form of an IIL structure are used for effecting level shifting.

FIG. 6 is a circuit diagram of a modification of the circuit of FIG. 4. In the circuit of FIG. 6, the manner of signal transmission from the third layer to the first layer has been improved with respect to that of FIG. 4, and the same elements and parts as in FIG. 4 are designated at like numerals. Signal transmission from the third layer to the first layer in the circuit of FIG. 6, is performed via transistors 41, 61 and 5. The transistors 41 and 61 are of IIL structure, and the transistor 61 is one having no injector. Although the transistor 41 operates during the off-state of the transistor 1-7, its ability to drive the next stage is poor because currents flow through both the emitter and collector of the transistor 41; namely, the transistor 41 is in a saturated condition. For this reason, the diode 13 in FIG. 4 is replaced by the transistor 61 of FIG. 6. Thus the transistor 61 functions as an emitter follower which also serves as a level-shifter, and therefore, the collector and emitter thereof are not in the saturated condition. Furthermore, since the relationship between the collector and emitter of the transistor 61 is opposite to that of an npn transistor of an ordinary IIL structure, the current amplification factor is high. Accordingly, the transistor 5 can be driven stably. The method of level shifting illustrated in FIG. 6 can be used effectively when there are a level difference of more than one layer, and cannot be used for a level difference of one layer.

The transistors 15, 16 and 17 constitute a constant-current discharging circuit 20 for discharging the base charge of the transistor 5 in the same manner as in FIG. 2.

Summarizing the present invention, as will be apparent from the above-described various embodiments of stacked IIL arrangement, the present invention provides various advantages as follows:

(1) In the case of transmitting a signal from the first layer to the third layer, an unnecessarily wide range of the base voltage is limited because of the operation of the diodes 11 and 12, and therefore, interval required for charging parasitic capacitance decreases, resulting in the reduction of signal transmission time.

(2) In the case of transmitting a signal from the third layer to the first layer, switching time can be drastically shortened by providing a circuit for discharging the base charge of the transistor used for level shifting.

(3) Since the discharging current varies in accordance with the total current flowing into the entire stacked IIL circuit, the entire stacked IIL circuit can operate throughout a wide range of the total current from the current source.

(4) High speed and stable level shifting can be performed even with a transistor having an IIL structure, if the transistor is used so that its current amplification factor is sufficiently large as in the embodiment of FIG. 6.

(5) The level shifting circuit can be constructed of a small number of elements in any of the circuit arrangements according to the present invention, and therefore, the area of an IC chip of IIL structure does not increase.

Although the above-described embodiments of the present invention are of three-layer structure, the number of layers of IIL circuits to be stacked can be freely changed. Furthermore, the method of signal transmission may be changed if desired. For instance, assuming that there are stacked four layers, the output signal of the first layer may be applied to any one of the second to the fourth layers, while the input signal of the first layer may be derived from any one of the second to fourth layers. Although, each of the diodes 11, 12 and 13 is singularly interposed between two layers, a series connection of two or more diodes may be interposed for effecting signal transmission depending on the level difference between two layers.

From the foregoing description, it will be understood that in the present invention, since a discharging circuit is provided for the transistor, which is used for level shifting and preferably, a charging circuit and diodes are provided, charging and discharging time for charge at the bases of various transistors can be reduced, so that signal transmission time can be reduced, while a semiconductor integrated circuit which oeprates at a high speed, and has superior characteristics, can be actualized. The above-described embodiments are just examples of the present invention, and therefore, it will be understood by those skilled in the art that many modifications and variations may be made without departing from the scope and spirit of the invention as described in the claims appended hereto.

What is claimed is:

1. A semiconductor integrated circuit comprising:
   (a) a plurality of IIL circuits each having a plurality of IIL gates constructed of a plurality of transistors, said IIL circuits being stacked in the form of a multi-layer in such a manner that an injector terminal of an $n^{th}$ layer in the stacked arrangement is connected to a reference terminal of an $(n+1)^{th}$ layer, wherein "n" is an integer;
   (b) first means for transmitting a signal from each of said layers to another one of said layers in one direction;
   (c) second means for shifting the level of a signal from a given layer when transmitting said signal to another layer in a direction opposite to said one direction, said second means having a first transistor of pnp type whose base is connected to an output terminal of said given layer and whose emitter is connected to an injector terminal of said given layer, and a second transistor of npn type whose base is connected to a collector of said first transistor for receiving a signal from said first transistor, said second transistor being connected at its collector to an input terminal of said another layer and at its emitter to a reference terminal of said another layer, and a charging circuit having a resistor coupled between said injector terminal of said given layer and the base of said first transistor; and
   (d) a discharging circuit connected to said base of said second transistor.

2. A semiconductor integrated circuit comprising:
   (a) a plurality of IIL circuits each having a plurality of IIL gates constructed of a plurality of transistors, said IIL circuits being stacked in the form of a multi-layer in such a manner that an injector terminal of an $n^{th}$ layer in the stacked arrangement is connected to a reference terminal of an $(n+1)^{th}$ layer, wherein "n" is an integer;

(b) first means for transmitting a signal from each of said layers to another one of said layers in one direction;

(c) second means for shifting the level of a signal from a given layer when transmitting said signal to another layer in a direction opposite to said one direction, said second means having a first transistor whose base is connected to an output terminal of said given layer and whose emitter is connected to an injector terminal of said given layer, and a second transistor whose base is connected to a collector of said first transistor for receiving a signal from said first transistor, said second transistor being connected at its collector to an input terminal of said another layer and at its emitter to a reference terminal of said another layer, and a charging circuit having a resistor coupled between said injector terminal of said given layer and the base of said first transistor; and (d) a discharging circuit connected to said base of said second transistor.

3. A seminconductor integrated circuit comprising:

(a) a plurality of IIL circuits each having a plurality of IIL gates constructed of a plurality of transistors, said IIL cicuits being stacked in the form of a multi-layer in such a manner that an injector terminal of an $n^{th}$ layer in the stacked arrangement is connected to a reference terminal of an $(n+1)^{th}$ layer, wherein "n" is an integer;

(b) first means for transmitting a signal from each of said layers to another one of said layers in one direction;

(c) second means for shifting the level of a signal from a given layer when transmitting said signal to another layer in a one direction opposite to said direction, said second means having a first transistor of npn type whose base is connected to an output terminal of said given layer and whose emitter is connected to a reference terminal of said given layer, a second transistor having a base connected to the collector of said first transistor, an emitter connected to the emitter of said first transistor, and a collector from which said signal from said given layer is derived, and a third transistor of npn type whose base is connected to the collector of said second transistor for receiving a signal from said first transistor, said third transistor being connected at its first collector to an input terminal of said another layer, and at its emitter to a reference terminal of said another layer;

(d) a discharging circuit connected to said base of said third transistor; and (e) a charging circuit comprising an IIL injector transistor coupled between said injector terminal of said given layer and the base of said first transistor.

4. A semiconductor integrated circuit comprising:

(a) a plurality of IIL circuits each having a plurality of IIL gates constructed of a plurality of transistors, said IIL circuits being stacked in the form of a multi-layer in such a manner than an injector terminal of an $n^{th}$ layer in the stacked arrangement is connected to a reference terminal of an $(n+1)^{th}$ layer, wherein "n" is an integer;

(b) first means for transmitting a signal from each of said layers to another one of said layers in one direction;

(c) second means for shifting the level of a signal from a given layer when transmitting said signal to another layer in a one direction opposite to said direction, said second means having a first transistor whose base is connected to an output terminal of said given layer and whose emitter is connected to a reference terminal of said given layer, a second transistor having a base connected to the collector of said first transistor, an emitter connected to the emitter of said first transistor, and a collector from which said signal from said given layer is derived, and a third transistor whose base is connected to the collector of said second transistor for receiving a signal from said first transistor, said third transistor being connected at its collector to an input terminal of said another layer, and at its emitter to a reference terminal of said another layer;

(d) a discharging circuit connected to said base of said third transistor; and (e) a charging circuit comprising an IIL injector transistor coupled between said injector terminal of said given layer and the base of said first transistor.

5. A semiconductor integrated circuit comprising:

(a) a plurality of IIL circuits each having a plurality of IIL gates constructed of a plurality of transistors, said IIL circuits being stacked in the form of a multi-layer in such a manner that an injector terminal of an $n^{th}$ layer in the stacked arrangement is connected to a reference terminal of an $(n+1)^{th}$ layer, wherein "n" is an integer;

(b) first means for transmitting a signal from each of said layers to another one of said layers in one direction;

(c) second means for shifting the level of a signal from a given layer when transmitting said signal to another layer in a direction opposite to said one direction, said second means having a first transistor of npn type whose base is connected to an output terminal of said given layer and whose collector is connected to an injector terminal of said given layer whereby said first transistor is prevented from being saturated, and a second transistor whose base is responsive to a signal from an emitter of said first transistor, said second transistor being connected at its collector to an input terminal of said another layer, and at its emitter to a reference terminal of said another layer.

6. A semiconductor integrated circuit as claimed in any one of claims 1, 2, 3, 4 or 5 wherein said first means comprises a diode coupled between a collector of an output transistor of one of said layers and a base of an input of another one of said layers.

7. A semiconductor integrated circuit as claimed in any one of claims 1 or 2, wherein said discharging circuit comprises a constant-current circuit.

8. A semiconductor integrated circuit as claimed in any one of claims 3 or 4, wherein said discharging circuit comprises a constant-current circuit.

9. A semiconductor integrated circuit as claimed in claim 8, wherein said constant-current circuit comprises a current-mirror circuit having a IIL structure.

10. A semiconductor integrated circuit as claimed in claim 9, wherein said current-mirror circuit comprises a pair of transistors each having a base connected to each other, a collector of one of said pair being connected to said bases of said pair, a collector of the other of said pair being connected to said base of said third transistor.

11. A circuit as recited in claim 5 wherein said first transistor is connected in an emitter follower configuration.

12. A circuit as recited in claim 4 wherein said discharging circuit comprises a resistor.

13. A circuit as recited in claim 4 further comprising a diode coupled between said first and second transistors.

14. A semiconductor integrated circuit comprising:
 (a) a plurality of IIL circuits each having a plurality of IIL gates constructed of a plurality of transistors, said IIL circuits being stacked in the form of a multi-layer in such a manner that an injector terminal of an $n^{th}$ layer in the stacked arrangement is connected to a reference terminal of an $(n+1)^{th}$ layer, wherein "n" is an integer;
 (b) first means for transmitting a signal from each of said layers to another one of said layers in one direction;
 (c) second means for shifting the level of a signal from a given layer when transmitting said signal to another layer in a direction opposite to said one direction, said second means having a first transistor whose base is connected to an output terminal of said given layer and whose emitter is connected to a reference terminal of said given layer, and a second transistor whose base is connected to the collector of said first transistor for receiving a signal from said first transistor, said second transistor being connected its collector to an input terminal of said another layer, and at its emitter to a reference terminal of said another layer;
 (d) a discharging circuit connected to said base of said second transistor; and
 (e) a charging circuit comprising an IIL injector transistor coupled between said injector terminal of said given layer and the base of said first transistor.

15. A semiconductor integrated circuit comprising:
 (a) a plurality of IIL circuits each having a plurality of IIL gates constructed of a plurality of transistors, said IIL circuits being stacked in the form of a multi-layer in such a manner that an injector terminal of an $n^{th}$ layer in the stacked arrangement is connected to a reference terminal of an $(n+1)^{th}$ layer, wherein "n" is an integer;
 (b) first means for transmitting a signal from each of said layers to another one of said layers in one direction;
 (c) second means for shifting the level of a signal from a given layer when transmitting said signal to another layer in a direction opposite to said one direction, said second means having a first transistor whose base is connected to an output terminal of said given layer and whose emitter is conected to an injector terminal of said given layer, and a second transistor whose base is connected to the collector of said first transistor for receiving a signal from said first transistor, said second transistor being connected at its collector to an input terminal of said another layer, and at its emitter to a reference terminal of said another layer;
 (d) a discharging circuit connected to said base of said second transistor; and
 (e) a charging circuit comprising an IIL injector transistor coupled between said injector terminal of said given layer and the base of said first transistor.

16. A semiconductor integrated circuit as claimed in claim 14 or 15 wherein said discharging circuit comprises a constant-current circuit.

17. A semiconductor integrated circuit as claimed in claim 16 wherein said constant-current circuit comprises a current-mirror circuit having a IIL structure.

18. A semiconductor integrated circuit as claimed in claim 17 wherein said current-mirror circuit comprises a pair of transistors each having a base connected to each other, a collector of one of said pair being connected to said bases of said pair, a collector of the other of said pair being connected to said base of said second transistor.

19. A semiconductor integrated circuit as claimed in claim any one of claims 3, 4, 14 or 15, wherein said charging circuit comprises a constant-current circuit.

20. A semiconductor integrated circuit as claimed in claim 19, wherein said constant-current circuit comprises an injector transistor of an IIL circuit.

21. A semiconductor integrated circuit as claimed in any one of claims 5, 14 or 15, further comprising a diode coupled between said first and second transistors.

22. A semiconductor integrated circuit as claimed in claim 2, further comprising a power source terminal to which said injector input terminal of said given layer is connected, said given layer being located at the top of the stacked arrangement.

* * * * *